United States Patent [19]
Miller et al.

[11] Patent Number: 5,726,474
[45] Date of Patent: Mar. 10, 1998

[54] FIELD EFFECT CONTROLLED SEMICONDUCTOR COMPONENT WITH INTEGRATED RESISTANCE THEREIN

[75] Inventors: Gerhard Miller, Penzing; Thomas Laska; Alfred Porst, both of Munich, all of Germany

[73] Assignee: Siemens Aktiengesellschaft, Munich, Germany

[21] Appl. No.: 617,566

[22] Filed: Mar. 19, 1996

[30] Foreign Application Priority Data

Apr. 5, 1995 [DE] Germany ............ 195 12 799.4

[51] Int. Cl.$^6$ .................................................. H01L 29/41
[52] U.S. Cl. ........................ 257/364; 257/536; 257/379
[58] Field of Search ........................... 257/364, 536, 257/537, 538, 379, 380; 437/61, 62, 180, 189, 918

[56] References Cited

U.S. PATENT DOCUMENTS 5,182,225   1/1993   Matthews .................... 257/379
5,436,197   7/1995   Hause ......................... 257/786

OTHER PUBLICATIONS

Muroga, "VLSI System Design", Wiley & Sons, New York 1982, p. 251.

Primary Examiner—Wael Fahmy
Assistant Examiner—David B. Hardy
Attorney, Agent, or Firm—Hill, Steadman & Simpson

[57] ABSTRACT

A semiconductor body is covered by a polysilicon layer having a gate electrode and a contact surface for fastening a gate lead. An integrated ohmic resistor connects the gate electrode to the contact surface.

7 Claims, 2 Drawing Sheets

FIELD EFFECT CONTROLLED SEMICONDUCTOR COMPONENT WITH INTEGRATED RESISTANCE THEREIN

BACKGROUND OF THE INVENTION

1. Field of the Invention

The invention is directed to a field effect controlled semiconductor component. This component has a semiconductor body on which a doped polysilicon layer is arranged and insulated from the surface of the semiconductor body. The doped polysilicon layer has two parts. The first part of the polysilicon layer is a gate electrode and the second part is a contact surface for a gate lead.

2. Description of Prior Art

Semiconductor components controllable by field effect of the above general type, such as power MOSFETs or IGBTs, are known in the art. In modules, many such semiconductor components are generally connected in parallel. The parasitic line inductances in the control circuit tend to oscillate when activated. This oscillation prevents a defined (simultaneous) turn-on of all components.

In the past, resistor chips were built into the modules. These resistor chips are connected by bond wires to the gate terminals of the semiconductor components and the external gate terminals of the module. A solution to this problem requires additional space in the module and additional connecting lines.

SUMMARY OF THE INVENTION

An object of the invention is based on improving a field effect controlled semiconductor component that is suited for parallel circuitry even without separate resistors.

This object is achieved by electrically connecting the contact surface to the gate electrode through at least one integrated ohmic resistor. The integrated ohmic resistor lies between the contact surface and the gate electrode.

The invention is explained in greater detail on the basis of a few exemplary embodiments in conjunction with the drawings.

DESCRIPTION OF THE PREFERRED EMBODIMENTS

Figure 1:
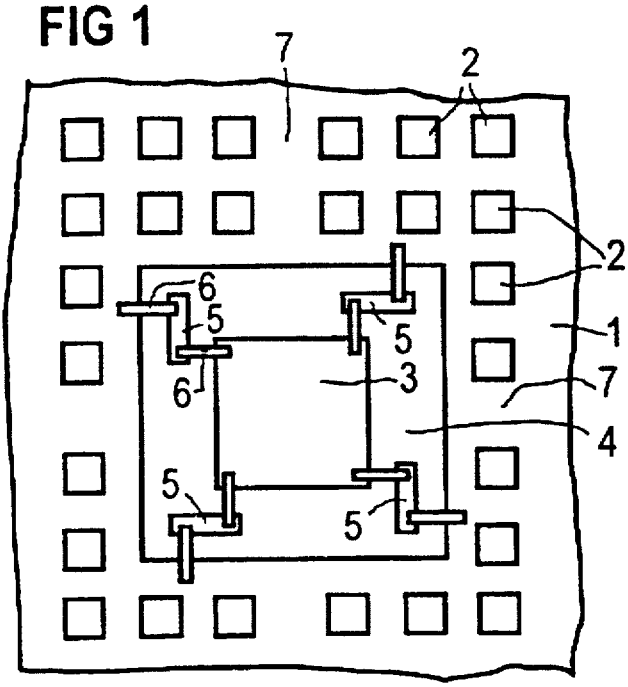
FIG. 1 is a plan view of a preferred embodiment of a semiconductor component.

FIG. 1 shows a portion of a field effect controlled semiconductor component. The surface of a semiconductor body is covered with an insulating layer (not shown). The doped polysilicon layer is arranged on top of the insulating layer. The polysilicon layer has a first part that serves as the gate electrode 1 and a second part that forms the contact surface 3 for fastening a gate lead. The gate electrode 1 is provided with openings 2 that are insulated from the polysilicon layer through which the source zones of the individual cells of the semiconductor component are contacted. These openings 2 form a regular pattern distributed over the surface of the gate electrode 1. Broader areas 7 can be free of holes between neighboring cells for the acceptance of gate contact fingers for better distribution of the gate potential given larger chips.

The gate electrode 1 has a recess 4 in which the contact surface 3 is arranged. The doped polysilicon layer is etched between the contact surface 3 and the gate electrode 1. Islands 5 that form integrated ohmic resistors lie in the recess 4 between the contact surface 3 and the gate electrode 1. These integrated ohmic resistors are preferably composed of doped polycrystalline silicon and have the same doping as the contact surface 3 and the gate electrode 1. They also preferably have the same thickness as the gate electrode 1 and the contact surface 3.

The islands 5 are connected by interconnects 6 to the gate electrode 1 and the contact surface 3.

The islands 5 can be produced simultaneously with the structuring of the contact surface 3 and of the gate electrode 1. Their length and their cross section are based on the intended size of the gate resistor $R_g$ (not shown), i.e., the desired voltage drop thereacross.

Figure 2:
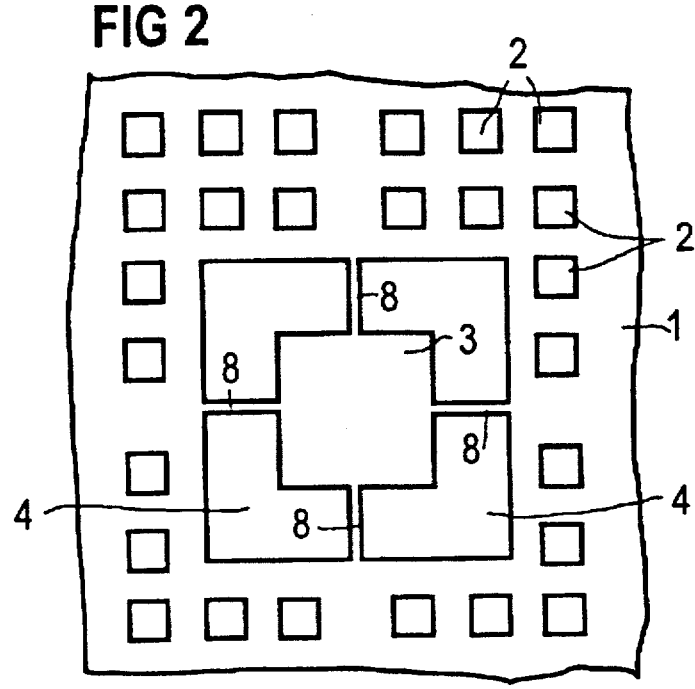
FIG. 2 is a plan view of an alternative embodiment.

In FIG. 2, the contact surface 3 is connected to the gate electrode 1 by ridges 8. The ridges 8 are composed of polysilicon. Their length and their cross section are again based on the intended value of resistance of the gate resistor $R_g$.

The islands 5 in FIG. 1 or the ridges 8 in FIG. 2 are formed by 0.5 to 1 µm thick polysilicon according to an exemplary embodiment. Their width and their length can amount to 0.5 mm. The polysilicon can be doped such that it has a resistance of 20 ohms/□.

Figure 3:
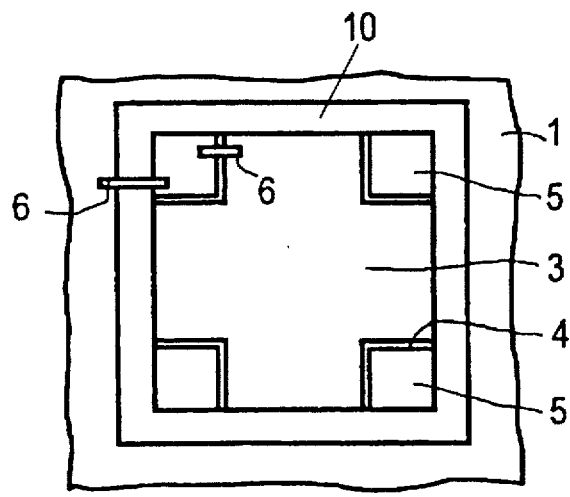
FIG. 3 is a plan view of an alternative embodiment.

The embodiment in FIG. 3 differs from that in FIG. 1 in that the islands 5 are arranged in the recesses 4 of a contact surface 3. Here, as in the embodiment of FIG. 1, the islands 5 are contacted by interconnects to the contact surface 3 and the gate electrode 1. As shown, the recesses 4 can lie at the corners of the contact surface 3 or at some other locations of the circumference. Like the recesses 4, the islands 5 can be quadratic; other shapes are also possible.

Figure 4:
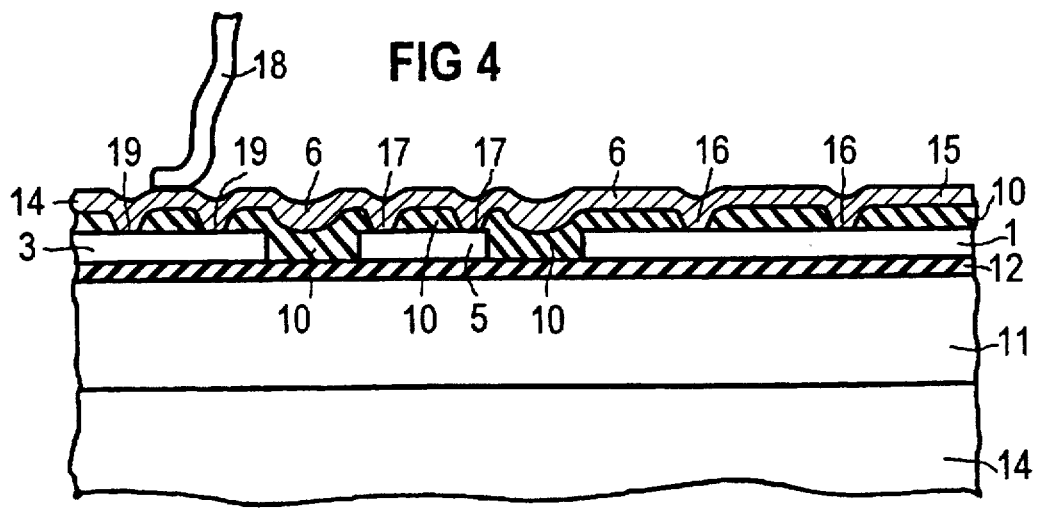
FIG. 4 is a sectional view of an embodiment.

FIG. 4 shows the surface of a semiconductor component having semiconductor zones 11, 13 covered with an oxide layer 12. The structured polysilicon layer is composed of the contact surface 3, the islands 5 and the gate electrode 1. This structured layer lies on the oxide layer 12. An insulating layer 10, which covers the gate electrode 1, the contact surface 3 and the islands 5, lies on the polysilicon layer. A metal layer 14 is arranged on the insulating layer 10 above the contact surface 3. A gate contact finger 15 mentioned in conjunction with FIG. 1 is seated on the gate electrode 1. It is formed as part of the metal layer 14. The metal layer 14 on the contact surface 3 is electrically connected with the polysilicon layer by the holes 19. In the same way, the gate contact finger 15 is connected to the gate electrode 1 by holes 16. Since the island 5 is also covered with the oxide layer 10, the separate interconnects 6 are connected over holes 17 to the polysilicon of the island 5, which represents the resistor. The metal layer 14 is in communication with an external terminal of the semiconductor component via a bond wire 18.

Only a single resistor island 5 was shown in the section of FIG. 4 by way of simplification. As in FIGS. 1, 2 and 3, however, a plurality of resistors can also be integrated. The value of resistance for $R_g$ is then lowered corresponding to the plurality of resistors connected in parallel.

Although modifications and changes may be suggested by those skilled in the art, it is the intention of the inventors to embody within the patent warranted hereon all changes and modifications as reasonably and properly come within the scope of their contribution to the art.

I claim as my invention:

1. A field effect controlled semiconductor component comprising;
    a semiconductor body; and
    a doped polysilicon layer having a gate electrode and a rectangular contact surface for a gate lead disposed on and insulated from the semiconductor body, said contact surface having an ohmic resistor disposed substantially at each corner, the ohmic resistor connecting the gate electrode to the contact surface of the doped polysilicon layer.

2. The semiconductor component according to claim 1, wherein the ohmic resistor is an island composed of doped polycrystalline silicon.

3. The semiconductor component according to claim 1, wherein the ohmic resistor is a doped polycrystalline silicon ridge.

4. The semiconductor component according to claim 1, wherein a recess frames the contact surface and the ohmic resistor is arranged within the recess.

5. A field effect controlled semiconductor component comprising:
    a semiconductor body; and
    a doped polysilicon layer having a gate electrode and a rectangular contact surface for a gate lead disposed on an insulated from the semiconductor body, said rectangular contact surface having a quadratic recess within each corner of the contact surface and an ohmic resistor arranged in each recess, the ohmic resistor connecting the gate electrode to the contact surface of the doped polysilicon layer.

6. A field effect controlled semiconductor component comprising:
    a semiconductor body;
    a doped polysilicon layer having a gate electrode and a contact surface for a gate lead disposed on and insulated from the semiconductor body;
    an integrated ohmic resistor connecting the gate electrode to the contact surface of the doped polysilicon layer;
    an insulating layer on the contact surface, the gate electrode and the ohmic resistor;
    a metal layer on the insulating layer above both the gate electrode and the contact surface and connected to the gate electrode and the contact surface; and
    an external terminal of the semiconductor component communicates with the metal layer.

7. A method for manufacturing a field effect controlled semiconductor component which comprises:
    producing an oxide layer on a semiconductor zone of a semiconductor body;
    producing a contact surface, a gate electrode and an ohmic resistor on the oxide layer;
    producing an insulating layer on the contact surface, the gate electrode and the ohmic resistor;
    producing a metal layer on the insulating layer above the contact surface and the gate electrode;
    connecting the metal layer to the contact surface and the gate electrode;
    connecting the contact surface to the gate electrode via the ohmic resistor;
    communicating the metal layer with an external terminal of the semiconductor component.

* * * * *